United States Patent [19]

Mishima

[11] 4,296,384
[45] Oct. 20, 1981

[54] NOISE GENERATOR

[75] Inventor: Toshio Mishima, Kitamoto, Japan

[73] Assignee: Kabushiki Kaisha Kawai Gakki Seisakusho, Hamamatsu, Japan

[21] Appl. No.: 76,083

[22] Filed: Sep. 17, 1979

[30] Foreign Application Priority Data

Sep. 20, 1978 [JP] Japan ................................ 53-115393
Sep. 20, 1978 [JP] Japan ................................ 53-115394

[51] Int. Cl.³ .......................................... H03B 29/00
[52] U.S. Cl. ................................. 331/78; 235/92 PB
[58] Field of Search ................. 331/78, 104; 307/221, 307/226 R; 235/92 PB, 92 DM, 92 GT

[56] References Cited

U.S. PATENT DOCUMENTS 4,047,008  9/1977  Perkins ................................. 331/78

FOREIGN PATENT DOCUMENTS 2744217  4/1979  Fed. Rep. of Germany ........ 331/78

Primary Examiner—David K. Moore

[57] ABSTRACT

A noise generator in which a random pulse output is produced by a random pulse generator in synchronism with a predetermined clock and is stored in a latch circuit by a clock obtained by frequency dividing the predetermined clock to produce random pulses of a harmonic composition different from the abovesaid random pulse output, thus providing noises of two or more desired harmonic compositions from the random pulse generator.

A band noise generator in which parallel outputs from respective stages of a random pulse generator are divided into two, that is, inter and decimal bits; a noise band width is designated by a band width designating circuit; a frequency coefficient represented by an integer corresponding to the band width is read out by the integer bits; the frequency coefficient thus read out is added to a fundamental frequency coefficient represented by an integer, stored in a memory, to produce predetermined output bits; the output bits are added with the decimal bits from the random pulse generator and accumulated by an accumulator in synchronism with a clock to output predetermined high-order bits; and in accordance with the output content, a sine wave is read from a sine-wave table. Thus, a desired noise band width can be set by the band width designating circuit, and by accumulating the decimal bits using the accumulator, setting including the decimal bits is made possible, thereby obtaining band noises whose frequencies are set with high accuracy.

2 Claims, 16 Drawing Figures

CLOCK (fo)

OUT OF
SHIFT REGISTER

OUTPUT OF AND
CIRCUIT 12 (1/2 fo)

OUTPUT OF LATCH
CIRCUIT 13

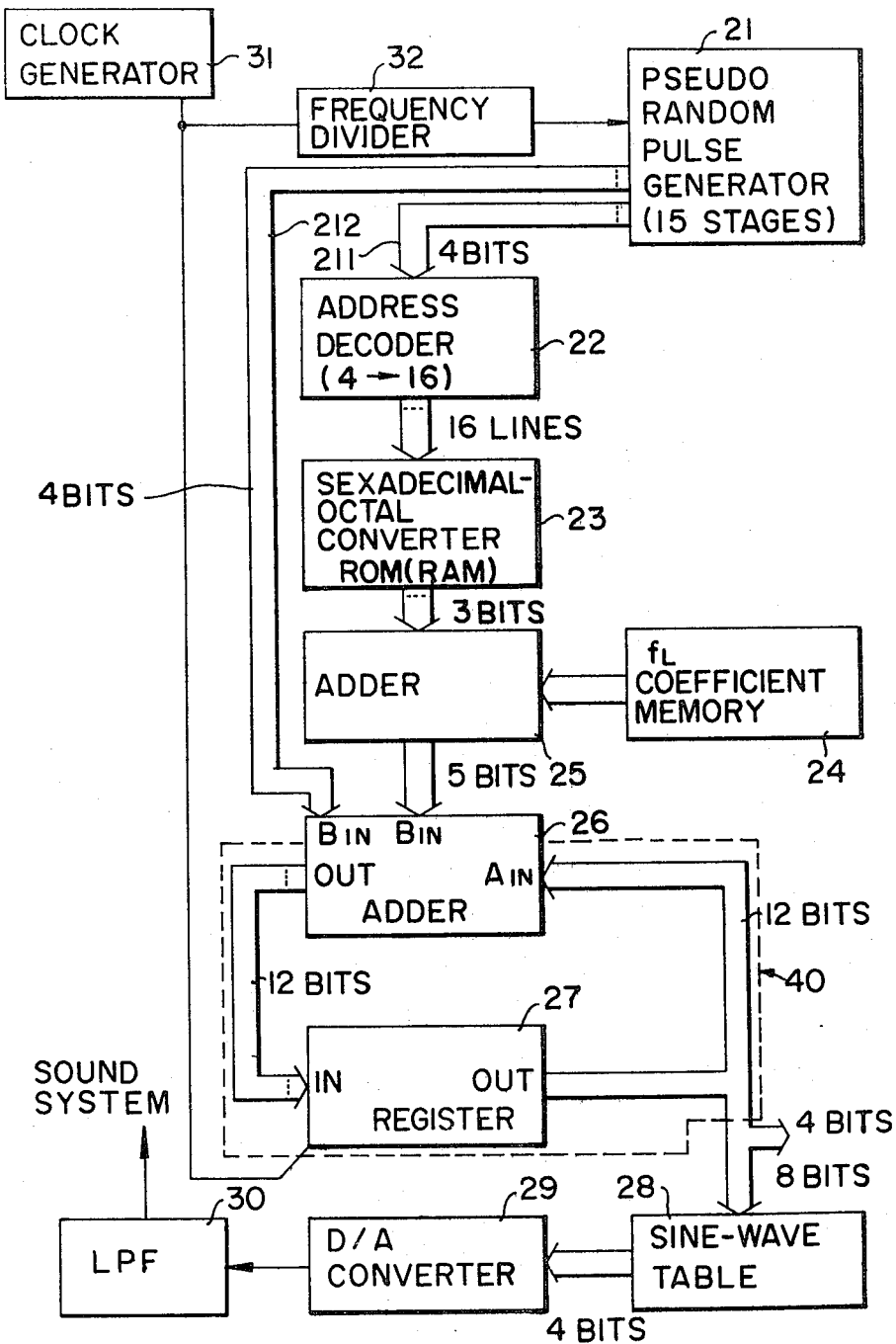

FIG. 7B FUNDAMENTAL FREQUENCY $f_L$
FIG. 7C INTEGER ORDER HARMONIC $2f_L$
FIG. 7D INTEGER ORDER HARMONIC $3f_L$
FIG. 7E $\begin{cases} 1/n_1 f_L \\ 1/m f_L \\ (1+1/n_2) f_L \end{cases}$
NON-INTEGER ORDER HARMONIC

FUNDAMENTAL

NOISE GENERATOR

BACKGROUND OF THE INVENTION

1. Field of the Invention

This invention relates to a noise generator, and more particularly to a noise generator which is capable of producing from one noise generating circuit a noise having a desired harmonic composition and a band noise set at a desired frequency with high accuracy.

2. Description of the Prior Art

As a noise source for use as a rhythm source of an electronic musical instrument, use has heretofore been made of a pseudorandom pulse generator shown in FIG. 1.

In the pseudo-random pulse generator of FIG. 1, for example, outputs from first and fifteenth stages of a 15-stage shift register 1 driven by a clock generator 5 are applied to an exclusive OR circuit 2 to derive therefrom "1" or "0" in dependence on whether the two inputs are of different levels or of the same level, and the output from the exclusive OR circuit 2 is returned via an OR circuit 3 to the T input of the shift register 1 to provide $2^{15}-1(32767)$ pseudo-random pulses from its fifteenth stage output $Q_{15}$.

The output from a NOR circuit 14 supplied with each stage output from the shift register 1 is applied via the OR circuit 3 to the T input of the shift register 1 to remove the state of "0" at its all stages, providing the initial condition that "1" is produced at all the stages.

By taking out parallel outputs $Q_1$ to $Q_{15}$ from the respective stages of the shift register 1 using the pseudo-random pulse generator 10 of such a construction, a successively changing random pulse output is obtained. The random pulse output is applied to a D-A converter 6 for conversion into an analog signal, which is provided via a low-pass filter 7 to a sound system 8.

In this case, unless a variable resistance of the clock generator 5 is varied, the harmonic composition of the noise derived from the low-pass filter 7 remains unchanged, and in the case of requiring two or more noise sources, it is necessary to prepare pseudo-random pulse generators of the same number as the required noise sources. In such a case, since a band noise is limited by an ordinary analog filter, highly precise frequency setting is difficult. In recent years, however, it is sometimes necessary to set frequencies with high accuracy, as rhythm sources of a cymbal and so forth, corresponding not only to integer order harmonics of a fumdamental frequency but also to its non-integer (fractional) order harmonics.

SUMMARY OF THE INVENTION

An object of this invention is to provide a noise generator which is adapted to be capable of producing noises of desired harmonic compositions from one noise generating circuit.

Another object of this invention is to provide a band noise generator which generates a band noise set at a frequency with high accuracy.

BRIEF DESCRIPTION OF THE DRAWINGS

FIG. 5 is an explanatory diagram illustrating the construction of another embodiment of this invention;

FIGS. 7A to 7E are diagrams explanatory of the operation of the embodiment shown in FIG. 5.

DESCRIPTION OF THE PREFERRED EMBODIMENTS

The present invention will hereinafter be described in detail with regard to its embodiments.

Figure 2:
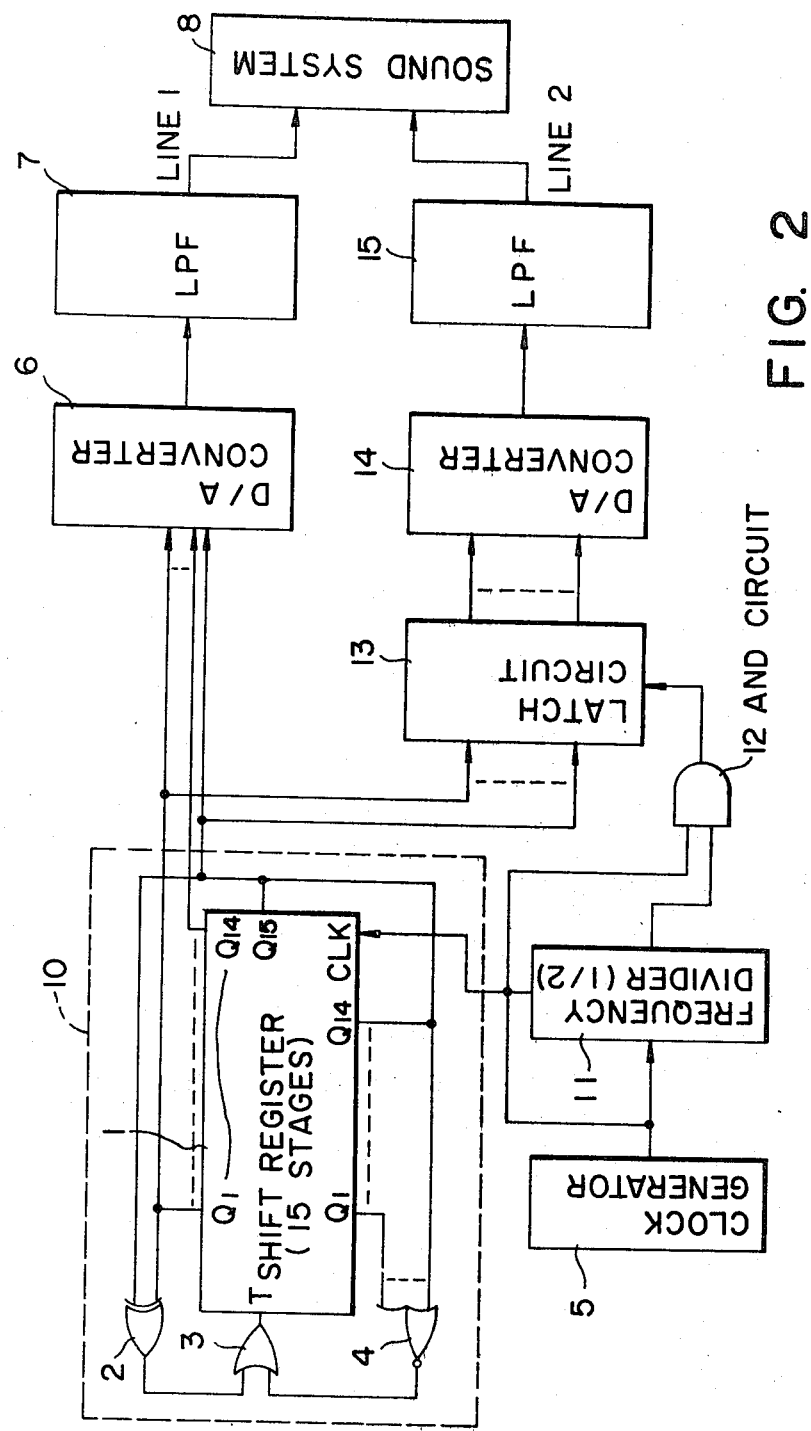
FIG. 2 is an explanatory diagram showing an embodiment of this invention.

FIG. 2 illustrates the construction of an embodiment of this invention, and FIGS. 3A to 3D are explanatory of its operation.

Figure 1:
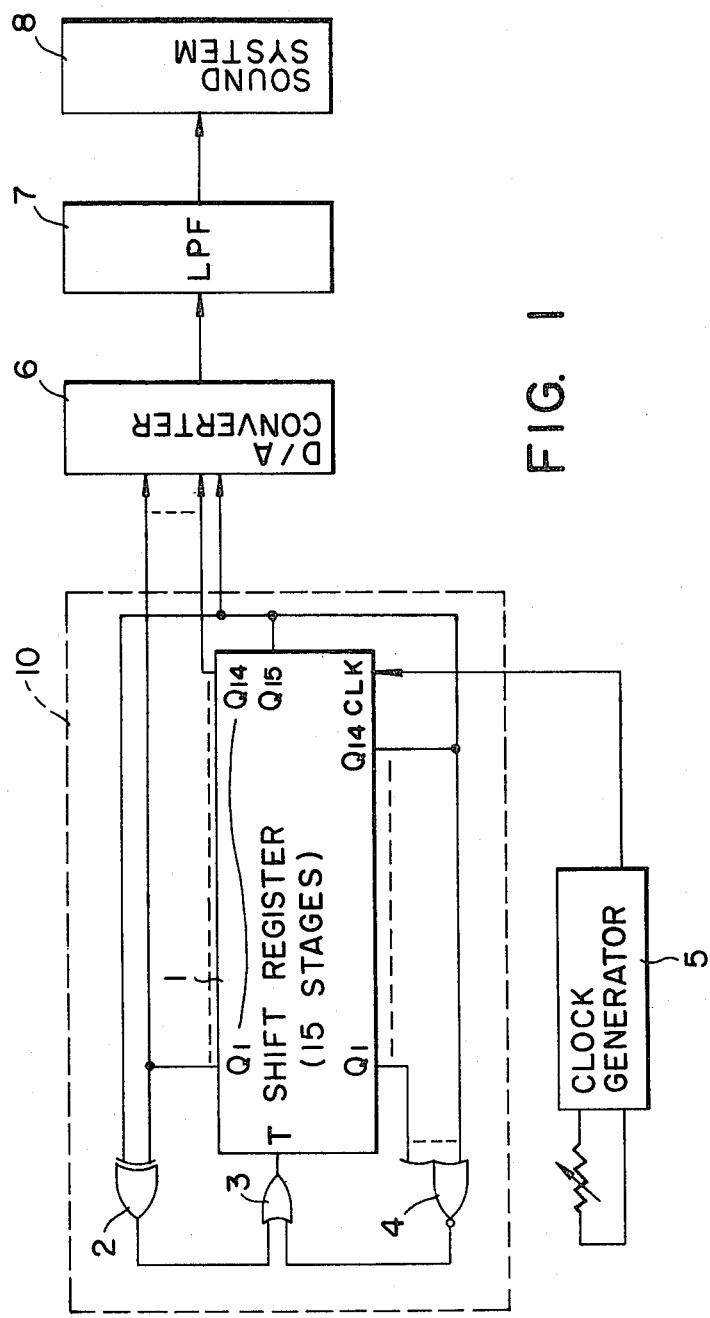
FIG. 1 illustrates a conventional pseudo-random pulse generator.
Figure 3A:
FIGS. 3A, 3B, 3C and 3D are timing charts explanatory of the operation of the embodiment shown in FIG. 2.
Figure 3B:
Figure 3C:
Figure 3D:
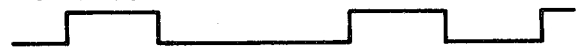

The embodiment of this invention shown in FIG. 2 differs in construction from the prior art pseudo-random pulse generator of FIG. 1 as follows: A clock of a frequency $f_0$ such as shown in FIG. 3A, which is derived from a clock generator 5, is frequency divided by a frequency divider 11 down to $\frac{1}{2}$, as shown in FIG. 3C, and the frequency-divided clock is provided via an AND circuit 12 to a latch circuit 13. On the other hand, let it be assumed that outputs $Q_1$ to $Q_{15}$ from a shift register 1 of a pseudo-random pulse generator 10 each have an output waveform such as for example, depicted in FIG. 3B. This output is applied to the latch circuit 13, wherein it is latched by the frequency-divided clock of the frequency $f_0/2$, supplied from the AND circuit 12; namely, the output is latched with the fall of the clock of FIG. 3C at the time of turning ON of the shift register 1 (FIG. 3B) and unlatched with the fall of the clock at the time of turning OFF to the shift register 1, as shown in FIG. 3D. In this way, the latch circuit 13 derives therefrom a random pulse output which is different from the random pulse output from the shift register 1. On other words, output from the shift register 1 is taken out at the rate of one every two output. The output from the latch circuit 13 is provided to a sound system 8 via a D-A converter 14 and a low-pass filter 15.

Figure 4A:
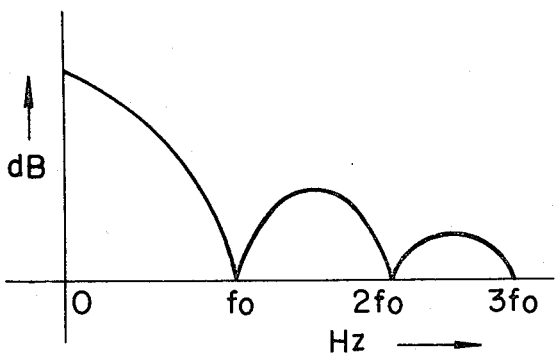
FIGS. 4A and 4B are diagrams explanatory of the effect of the embodiment shown in FIG. 2.
Figure 4B:
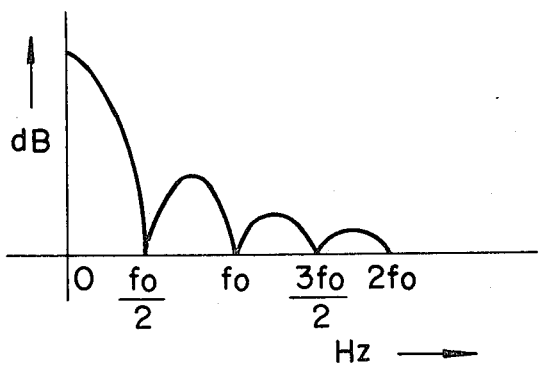

FIGS. 4A and 4B illustrate, in comparison, the frequency spectrums of the random pulse output which is derived from the shift register 1 with the clock of the frequency $f_0$ and the random pulse output which is latched with the clock of the frequency $f_0/2$ and derived from the latch circuit 13. That is, FIG. 4A shows the frequency spectrum on an output line 1 of a low-pass filter 7, and this random pulse output has harmonic components of the frequency $f_0$; and FIG. 4B shows the frequency spectrum on an output line 2 of the low-pass filter 15, and this random pulse output has harmonic components of the frequency $f_0/2$. The signal on the line 2 is substantially equivalent to the output from the low-pass filter 7 supplied with the signal on the line 1.

In this embodiment, the frequency dividing ratio of the frequency divider 11 is selected to be $\frac{1}{2}$ but may also be $1/n$.

As described above, in the embodiment of FIG. 2, a random pulse output is generated by a random pulse generator 10 in synchronism with a predetermined clock and is latched in a latch circuit 13 by the use of a clock obtained by frequency dividing the abovesaid clock, and from the latch circuit yielded random pulses of a harmonic composition different from the abovementioned random pulse output. With the present invention, it is possible to obtain noises of desired harmonic compositions and of two or more harmonic compositions from one random pulse generator 10.

Figure 6:
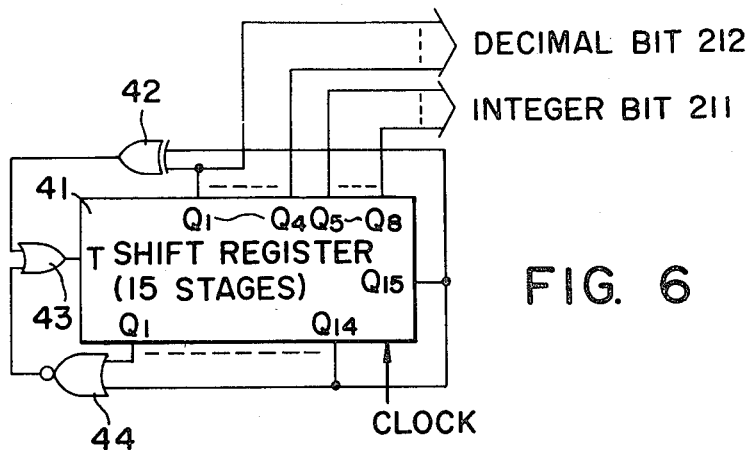
FIG. 6 is a detailed explanatory diagram of the principal part of the embodiment shown in FIG. 5.

FIG. 5 shows the construction of another embodiment of this invention. In FIG. 5, a pseudo-random pulse generator 21 is driven by a clock which is applied thereto via a frequency divider 32 from a clock generator 31. FIG. 6 illustrates an example of the pseudo-random pulse generator 21, which is similar to the random pulse generator 10 used in the embodiment of FIG. 2. In the pseudo-random pulse generator 21, for example, outputs from its first and fifteenth stages are applied to an exclusive OR circuit 42 to derive therefrom "1" or "0" in dependence on whether the two outputs are of different levels or of the same level, and this output is returned to the T input of the shift register 41 to provide from its fifteenth stage output $Q_{15}$ $2^{15} - 1(32767)$ pseudo-random pulses. The output from a NOR circuit 44 which is supplied with the output from each stage of the shift register 41 is applied via the OR circuit 43 to the T input of the shift register 41, to remove the state of its all stage outputs being "0", providing an initial condition of all stage outputs being "1". By using the pseudo-random pulse generator 21 of the abovesaid arrangement, four bits of the respective stage outputs $Q_1$ to $Q_{15}$ of the shift register 41 are outputted as integer bits 211 representing frequencies bearing integral relationships to a fundamental frequency in a predetermined frequency band, and other four bits are outputted as decimal bits 212 representing frequencies having non-integral relationships to the abovesaid fundamental frequency. The integer bits 211 are provided to a 4-bit sexadecimal address decoder 22, and its 16-line output is applied to a sexadecimal-octal converter 23 formed by a fixed memory (ROM) or random access memory (RAM) and converted thereby into a frequency coefficient represented by a 3-bit octal integer, which is applied to an adder 25. On the other hand, a fundamental frequency ($f_L$) coefficient of the predetermined band, represented by an integer, is loaded in a memory 24, and the outputs from the memory 24 and the sexadecimal-octal converter 23 are added together to yield a 5-bit output as an integer bit of the lowest harmonic of the band. The sexadecimal-octal converter 23 is generally arranged in the form of a sexadecimal-N converter and is used as a circuit for designating a noise band by changing N. The five integer bits from the adder 25 are applied to an input terminal $B_{IN}$ of an adder 26 together with the four decimal bits 212 from the random pulse generator 21. These inputs are accumulated by an accumulator 40 making up an address calculation loop with the adder 26 and a register 27, in synchronism with the clock from the clock generator 31, and eight high-order bits of a 12-bit output obtained by the calculation read a value stored in a sinewave table 28. The value read from the table 28 is converted by a D-A converter 29 into an analog quantity, which is applied to a low-pass filter 30 to remove a high-frequency noise produced during the D-A conversion, and then a band noise is transmitted to the sound system.

Now, a detailed description will be given of the accumulator 40 which forms the address calculation loop by the adder 26 and the register 27 and which is the principal part of the present embodiment. In synchronism with the clock, nine bits of the integer bits (five bits) and the decimal bits (four bits) are applied to the terminal $B_{IN}$ of the adder 26, but at the initial stage of operation, its terminal $A_{IN}$ is "0". In this state, nine bits are outputted at a terminal OUT of the adder 26, and at the same time, the same nine bits are inputted to a terminal IN of the register 27.

In synchronism with the clock, nine bits are outputted at the terminal OUT of the register 27 after one clock and are inputted to the terminal $A_{IN}$ of the adder 26, and at the same time, a 4-bit output is read from the sine-wave table 28 using the eight high-order bits as address bits. Upon occurrence of the next clock, the random pulse outputs from the pseudo-random pulse generator 21 are provided to the terminal $B_{IN}$ of the adder 26, so that a pulse train different from the integer and decimal bits at the initial stage of operation appears and is added to the integer and decimal bits at the terminal $A_{IN}$ of the adder 26. As a result of this, 9 bits + 9 bits = 9 ~ 10 bits. This is repeatedly accumulated by the address calculation loop, and twelve high-order bits are taken out, and eight high-order bits of them are inputted to the sine-wave table 28, with the other remaining four bits discarded. In this case, a carry of the decimal bits is added to the least significant bit of the integer bits. In this way, the inputs to the terminals $A_{IN}$ and $B_{IN}$ of the adder 26 are accumulated; if the shift register 41 of the pseudo-random pulse generator 21 has fifteen stages, then values stored in the sine-wave table 28 corresponding to random pulses having a length of $2^{15} - 1(32767)$ can be read out at random.

The frequency coefficient of the predetermined noise band, represented by an integer, is converted by the sexadecimal-octal converter 23 into a 3-bit octal number to determine the band noise width, and the output from the converter 23 and the coefficient of the fundamental frequency ($f_L$) from the memory 24 are added together by the adder 25, so that it is possible to read out the sine-wave table 28 which has stored therein integer-order (1, 2, . . . m) harmonics of the fundamental frequency with 256 words.

Unlike the integer bits, the decimal bits are not added to the fundamental frequency in the adder 25; hence, they have the property of representing not the integer-order harmonic but the non-integer-order harmonic components of the fundamental frequency. The decimal bits are accumulated by the address calculation loop and combined with the integer bits for reading the sine-wave table 28. Namely, the integer bits combined with the decimal bits are carried by the accumulation with the accumulator 40 and read out sine waves from the sine-wave table 28, resulting in the accuracy of the frequency setting being enhanced, as compared with that in the case of the prior art using only integer bits alone.

Figure 7A:
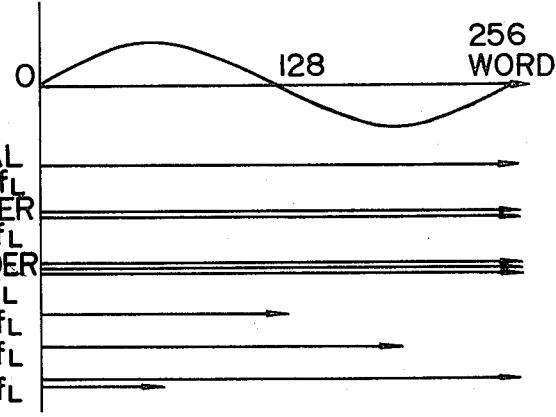
Figure 8:
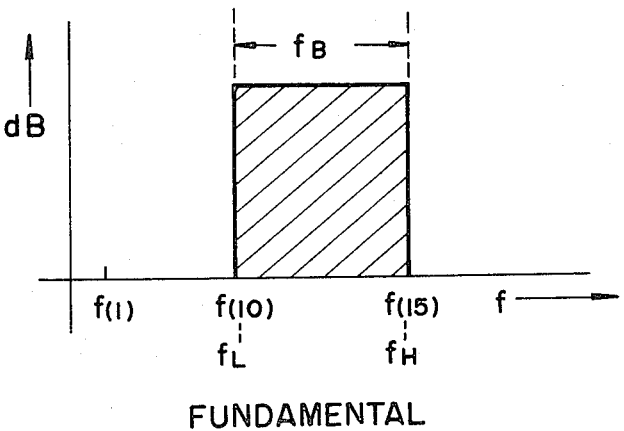
FIG. 8 shows the frequency spectrum characteristic of the embodiment shown in FIG. 5.

For example, in the case where the fundamental frequency $f_L = 10$ and a sine wave is stored in the sine-wave table 28 using 256 words, the number of times of the sine wave being read out per unit time is as shown in FIGS. 7A to 7E. FIG. 7A shows the sine wave; FIG. 7B shows the case of its fundamental frequency $f_L$; FIGS. 7C and 7D show the cases of integer-order harmonics $2f_L$ and $3f_L$; and FIG. 7E shows the cases of non-integer order harmonics $1/n_1 f_L$, $1/m \, f_L$ and $(1 + 1/n_2)f_L$. In the above, $n_1$, $m$ and $n_2$ are given numbers. Since the sine-wave table is read out with the integer order and non-integer order harmonics at random, such a frequency spectrum as shown in FIG. 8 is resulted, and in this while a carry of the decimal bits is achieved by accumulation.

The above operation will be described by way of example. In FIG. 5, in the case where the integer bits 211 are four bits as mentioned previously, they are applied to the address decoder 22 and then the output of address decoder are applied to the sexadecimal-octal converter 23 via $2^4=16$ line, which are used for addressing the read only memory (random access memory) of said converter 23. The read only memory (random access memory) has stored therein the staes "000" to "111" in octal, that is, binary number, and 0 to 7 in decimal number. The states 0 to 7 are sequentially outputted by random addresses. These 0 to 7 in decimal are added by the adder 25 to the fundamental frequency $f_L=10$ stored in the memory 24, and the noise band is provided in the numerical range of $0+10$ to $7+10=10$ to 17. In this case, if the clock frequency is 100 KHz, since the word number of the sine-wave table 28 is 256, the band width of the frequency $f_B$ of the band noise 20 becomes as follows:

$$f_L = \frac{100 \times 10^3}{256} \times 10 \leq f_B \leq f_H = \frac{100 \times 10^3}{256} \times 17 \quad (1)$$
$$3.9 \times 10^3 \text{ (Hz)} \leq f_B \leq 6.6 \times 10^3 \text{ (Hz)}$$

By applying the decimal bits to the adder 26, the following band width is resulted:

$$f_L = \frac{100 \times 10^3}{256} \times \left(10 + \frac{1}{2^4}\right) = 4.14 \text{ KHz} \quad (2)$$

$$f_H = \frac{100 \times 10^3}{256} \times (17 + 0.75) = 6.93 \text{ KHz}$$

$$\left(0.75 = \frac{1}{2^1} + \frac{1}{2^2} + \frac{1}{2^3} + \frac{1}{2^4}\right)$$

Accordingly, by setting the content of the sexadecimal-N converter 23 to an arbitrary value, the noise band width is determined; and by setting the coefficient to be stored in the memory 24, the fundamental frequency ($f_L$) is determined.

The above description has been given in respect of the band noise, but a low-pass and a high-pass noise can also be produced easily by properly setting the sexadecimal-N converter 23.

As has been described above, in the present invention, parallel outputs from respective stages of a random pulse generator are divided into two, that is, inter and decimal bits; a noise band width is designated by a band width designating circuit; a frequency coefficient represented by an integer corresponding to the band width is read out by the integer bits; the frequency coefficient thus read out is added to a fundamental frequency coefficient represented by a integer, stored in a memory, to produce predetermined output bits; the output bits are added with the decimal bits from the random pulse generator and accumulated by an accumulator in synchronism with a clock to output predetermined high-order bits; and in accordance with the output content, a sine wave is read from a sine-wave table. Thus, a desired noise band width can be set by the band width designating circuit, and by accumulating the decimal bits using the accumulator, setting including the decimal bits is made possible, thereby obtaining band noises whose frequencies are set at higher accuracy as compared with the accuracy in the case of conventional band width setting using integer bits alone.

It will be apparent that many modifications and variations may be effected without departing from the scope of the novel concepts of this invention.

What is claimed is:

1. A band noise generator comprising:
  a clock means producing a predetermined clock output,
  a random pulse generator for generating random pulses in synchronism with said clock output and for separating multistage parallel outputs into integer and decimal bits for output;
  a band width designating circuit for designating a predetermined noise band width and reading therefrom, by the integer bits, a frequency coefficient represented by an integer corresponding to the designated noise band width;
  a memory circuit for storing a fundamental frequency coefficient represented by an integer;
  an adder for adding together the frequency coefficient read from the band width designating circuit and the fundamental frequency coefficient from the memory circuit to output predetermined output bits;
  an accumulator for adding the decimal bits from the random pulse generator to the output bits from the adder and accumulating them in synchronism with the clock to output predetermined high-order bits; and
  a sine-wave table for reading therefrom a sine wave in accordance with the output content of the accumulator.

2. A noise generator comprising:
  a clock means producing a predetermined clock output,
  a random pulse generator for generating random pulses in synchronism with said clock output,
  divider means for frequency dividing said clock output to produce a latch signal, and
  latch means for receiving the output from the random pulse generator and said latch signal for outputting random pulses of different harmonic composition than that of the random pulse generator output.

* * * * *